US006307404B1

(12) United States Patent
DiTommaso

(10) Patent No.: US 6,307,404 B1
(45) Date of Patent: Oct. 23, 2001

(54) GATE STRUCTURES WITH REDUCED PROPAGATION-DELAY VARIATIONS

(75) Inventor: Vincenzo DiTommaso, Arlington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/301,094

(22) Filed: Apr. 28, 1999

(51) Int. Cl.[7] .......................... H03K 19/20; H03K 19/082
(52) U.S. Cl. .................................. 326/124; 326/89
(58) Field of Search ........................... 326/89, 109, 110, 326/112, 119, 124, 128, 127

(56) References Cited

U.S. PATENT DOCUMENTS

| 4,007,384 | 2/1977 | Brooks ................................. 307/218 |
| 5,047,672 | * 9/1991 | Bhuva et al. ......................... 326/128 |
| 5,159,214 | * 10/1992 | Okumura .............................. 326/110 |
| 5,359,553 | * 10/1994 | Shiomi ................................. 326/110 |
| 5,392,243 | * 2/1995 | Nakamura ............................. 327/51 |
| 5,463,332 | * 10/1995 | Yee et al. ............................. 326/126 |

FOREIGN PATENT DOCUMENTS

| 59-37736 | * 3/1984 | (JP) ..................................... 326/112 |
| 4-315314 | * 11/1992 | (JP) ...................................... 326/18 |

* cited by examiner

*Primary Examiner*—Michael Tokar
*Assistant Examiner*—Steven S. Paik
(74) *Attorney, Agent, or Firm*—Koppel & Jacobs

(57) ABSTRACT

Differential-signal gate structures are provided in which first and second current-switching modules are coupled to first and second electrical loads with the differential input ports of the modules cross coupled. Although each of the modules separately exhibits an increased propagation-delay response to one input signal sequence, they are never simultaneously exposed to this sequence because of the cross coupling of the input ports. Accordingly, these gate structures have significantly reduced propagation-delay variations.

18 Claims, 4 Drawing Sheets

GATE STRUCTURES WITH REDUCED PROPAGATION-DELAY VARIATIONS

BACKGROUND OF THE INVENTION

1. Field of the Invention

The present invention relates generally to logic gates and more particularly to differential-signal logic gates.

2. Description of the Related Art

As stated in various logic texts (e.g., McCalla, Thomas Richard, *Digital Logic and Computer Design*, Macmillan Publishing, New York, 1992, p. 68), a logic variable in Boolean algebra is defined independently of any physical system. An input signal is asserted (true) when the corresponding logic variable has value 1 and an output signal is asserted (true) when a condition exists to cause the associated function to have logic value 1.

A gate is a physical circuit having at least two inputs and an output that depends on logic combinations of input signals. A positive-logic physical system assigns a high voltage level H to logic value 1 and a low voltage level L to logic value 0. In contrast, the low voltage level L is assigned to logic value 1 and the high voltage level H to logic value 0 in a negative-logic physical system. Different logic functions can, therefore, be realized by the same physical gate. In a two-input positive-logic AND gate, for example, the output has a logic value 1 only when both inputs have the logic value 1. If this same gate is used in a negative-logic system, it executes the OR logic function and the output has a logic value 1 when either input or both inputs have the logic value 1.

Accordingly, this gate is typically termed an AND/OR gate and an exemplary single-ended version is described in U.S. Pat. No. 4,007,384. Two input transistors of this gate have bases that represent gate inputs A and B. The input transistors also have first emitters that direct current steering in a differential pair and second emitters which are cross coupled to supply collector currents of the differential pair. A reference transistor has a collector coupled to an output resistor and two emitters that are also coupled to supply the differential-pair collector currents. The reference transistor's base is biased so that its emitters supply the current of the differential-pair collectors except when A and B are both high.

In high-speed operations, gates structured to use differential signals are generally preferred because comparison of oppositely-moving differential signals is more precise than the comparison of a single-ended signal to a fixed threshold level. An exemplary differential-signal gate 20 is shown in FIG. 1. The gate 20 has a first differential pair 22 of transistors 23 and 24 and the pair has a common port 25 (the pair's common emitters), first and second output ports 27 and 28 (the pair's collectors) and a differential input port 30 (the pair's bases).

The gate 20 also has a second differential pair 32 of transistors 33 and 34 and this pair has a common port 35, first and second output ports 37 and 38 and a differential input port 40. The differential pairs 22 and 32 are arranged with the output port 27 of the first differential pair 22 coupled to the common port 35 of the second differential pair 32.

A first electrical load in the form of a first resistor 44 is coupled between the first output port 37 and a voltage source 45 and a second electrical load in the form of a second resistor 46 is coupled between the voltage source 45 and the second output ports 28 and 38 of respective differential pairs 22 and 32. Buffer stages in the form of emitter followers 50 and 52 are positioned to couple the voltages at the lower ends of resistors 44 and 46 to a gate output port 54.

In accordance with conventional integrated circuit design, current sources 56, 57 and 58 are connected at one end to a voltage source 60 and respectively connected at another end to the common port 25 of the differential pair 22, the emitter of emitter follower 50 and the emitter of emitter follower 52. The gate 20 can be supplemented with a level-shifting circuit 62 so that input signals operate at the same levels. The circuit 62 couples emitter-follower transistors 64 to current sources 66 and connects their emitters 68 to the present input port 30 as indicated by broken-line arrows 69. Input signals corresponding to port 30 are then applied at the differential input port 70 and level shifted by a diode drop.

In operation of the gate 20, the first differential pair 22 steers the current of the source 56 to a path 72 (between the output port 27 and the common port 35) and steers this current to the second resistor 46 in response to respective polarities of a differential input signal at the input port 30 (i.e., a high voltage at the upper side 76 of the input port 30 steers the current to the path 72 and a low voltage at this upper side steers the current to the resistor 46). The second differential pair 32 steers the current on the path 72 to the first resistor 44 and steers this current to the second resistor 46 in response to respective polarities of a differential input signal at the input port 40.

As shown in FIG. 1, signals at the differential ports 30, 40 and 54 are respectively symbolized by symbols A, B and Q. In a positive-logic system, it is apparent that Q will always be a logic value 0 when A is a logic value 0 because this input signal causes transistor 24 to steer current to the second resistor 46 thus dropping the voltage at the upper side of the output port 54. In this condition, the logic value of B is irrelevant since there is no current on the path 72 to be steered.

The output Q will have a logic value 1 only when A and B both have a logic value 1 because only in this case is the current of the current source 56 steered (through output ports 27 and 37) to the first resistor 44 which drops the voltage at the lower side of the output port 54. It is thus apparent that the gate 20 executes the logic function Q=AB in a positive-logic system and, consequently, the logic function Q=A+B in a negative-logic system.

Although the conventional gate 20 of FIG. 1 is simple, easily fabricated and economical and thus widely used, it exhibits variations in propagation delays (i.e., time delays before the output responds to the inputs) that are sequencing dependent. In particular, the propagation delay increases (in a positive-logic system) when B has a logic value 1 and A changes from a logic value 0 to a logic value 1. In response, Q changes from a logic value 0 to a logic value 1 but with an increased propagation delay compared to other input sequences.

Even small propagation-delay variations (e.g., ~20 picoseconds) can cause signal degradation in integrated-circuit gates that are operated at high-speed (e.g., >1 GHz) in applications (e.g., automatic test equipment) that demand high fidelity in signal parameters (e.g., signal timing, signal levels, and signal transitions).

SUMMARY OF THE INVENTION

The present invention is directed to differential-signal gate structures for use in high-speed (e.g., >1 GHz), high-fidelity applications (e.g., automatic test equipment). In particular, it is directed to gate structures having reduced propagation-delay variations.

These goals are realized with first and second electrical loads and first and second current-switching modules each coupled to the first and second electrical loads wherein the first module is formed of:

a) a first differential pair of transistors that steers a current to a signal path and steers it to the second load in response to respective polarities of an input signal at a first input port; and b) a second differential pair of transistors that steers the current on the signal path to the first load and steers it to the second load in response to respective polarities of an input signal at a second input port;

and wherein the second module is similarly formed but has its first and second input ports cross coupled with those of the first module.

Accordingly, each of the current-switching modules may separately exhibit an increased propagation-delay response to one input signal sequence but they are never simultaneously exposed to this sequence because of the cross coupling of the input ports.

In one gate embodiment, the transistors are bipolar transistors, the first and second electrical loads are respectively first and second resistors and an output port is driven with first and second buffer stages. In another gate embodiment, one of the transistors of the second differential pair has double emitters to facilitate a gate embodiment in which equal numbers of collectors are coupled to the first and second loads.

In bipolar gates in which the first current-switching module has propagation-delay variations of ~20 picoseconds, circuit simulations (e.g., Spice simulations) have shown that the teachings of the invention have substantially eliminated the variations. The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 2:
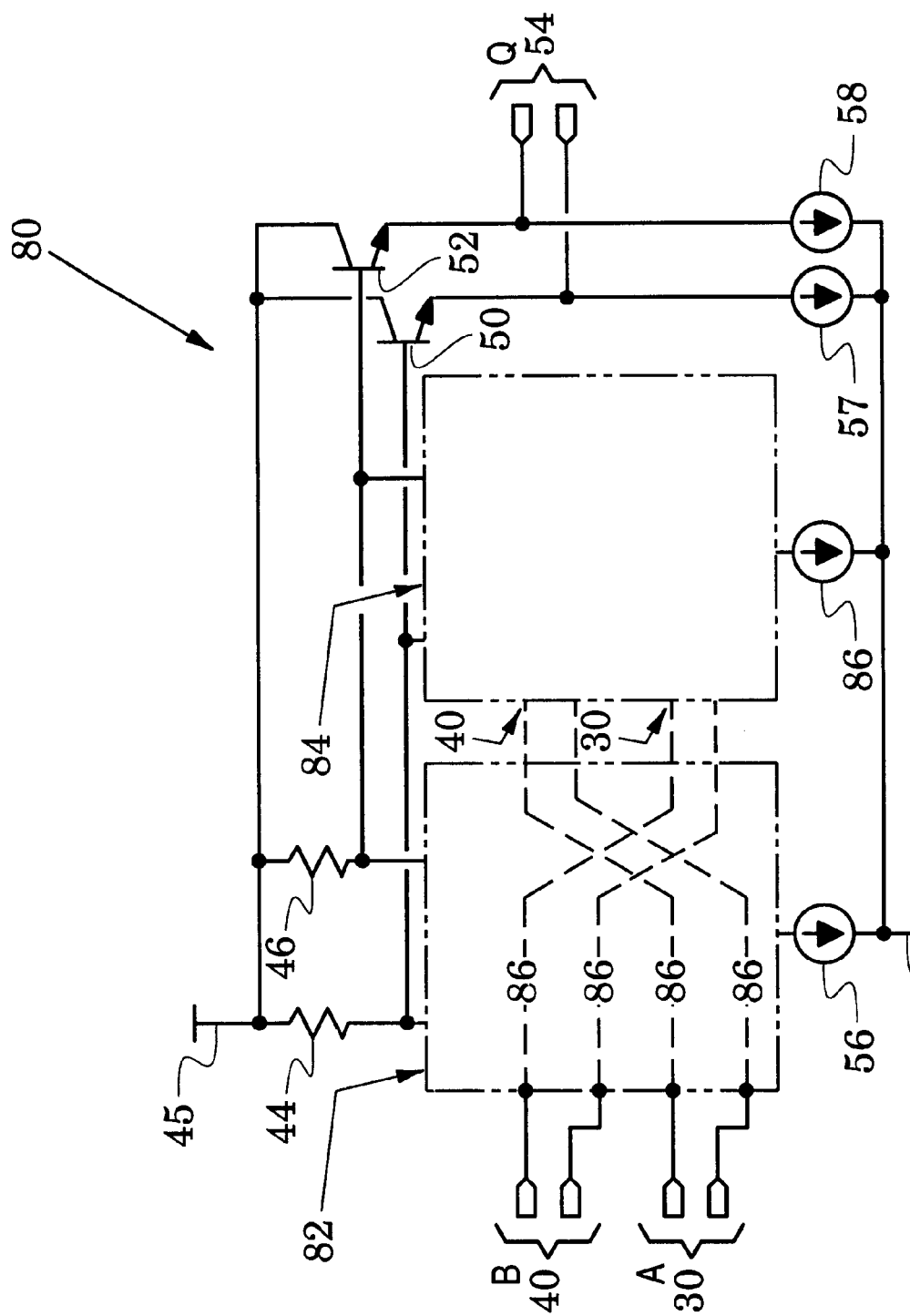
FIG. 2 is a schematic of an AND/OR gate structure of the present invention.

FIG. 2 illustrates a gate 80 in which propagation delays are substantially constant for all input sequences. An investigation of the gate's operation is preceded by the following description of the gate's structure.

Figure 1:
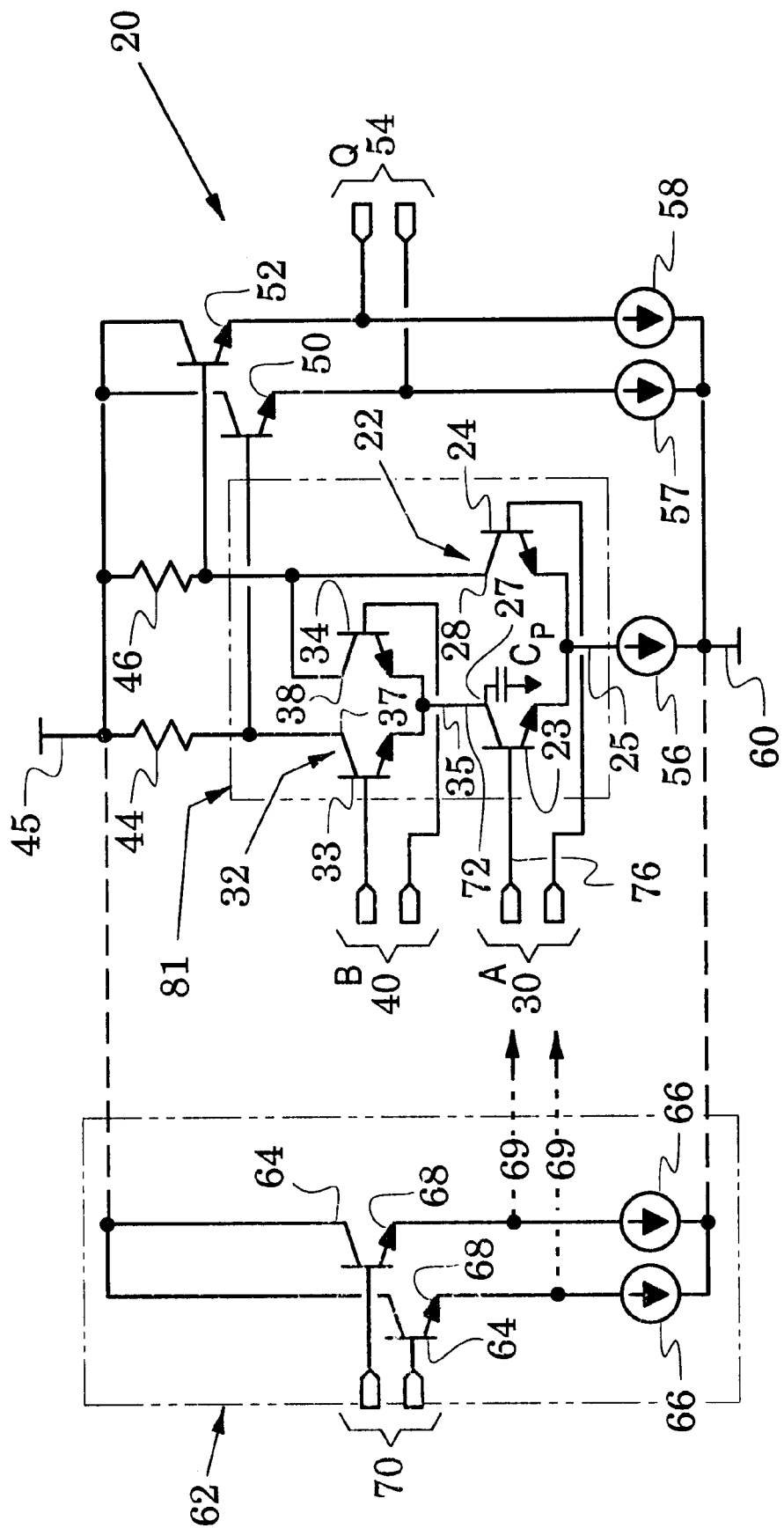
FIG. 1 is a schematic of a conventional AND/OR gate structure.

The gate 80 incorporates elements of the gate 20 of FIG. 1 with like elements indicated by like reference numbers and, in particular, it uses identical current-switching modules 82 and 84 whose structures are each the same as that within a current-switching module 81 that is indicated in FIG. 1 by a broken-line rectangle.

Each of the modules 82 and 84 is coupled at an upper side to the first and second resistors 44 and 46 and respectively coupled at a lower side to current sources 56 and 86. The output port 54 is again coupled respectively by emitter-follower transistors 50 and 52 to the resistors 44 and 46. The current of the transistors 50 and 52 are supplied by respective current sources 57 and 58 and the gate 80 is arranged between voltage sources 45 and 60.

Similar to the current-switching module 81 of FIG. 1, the current-switching module 82 has input ports 30 and 40. The identical current-switching module 84 also has input ports 30 and 40 but these ports are cross coupled to the input ports of the module 82 as indicated by broken lines 86 (i.e., ports 30 and 40 of module 84 are respectively coupled to ports 40 and 30 of module 82). The output port of the gate 80 is the port 54 and its input ports are the ports 30 and 40 of the current-switching module 82 and signals at these ports are respectively symbolized by symbols A, B and Q.

Expressed differently, the identical current-switching modules 82 and 84 have respective current sources 56 and 86 and are each coupled to first and second resistors 44 and 46 which are, in turn, each coupled to the output port 54 by respective transistors 50 and 52. However, the input ports of the current-switching modules 82 and 84 are cross coupled with the ports of one of them serving as the input ports 30 and 40 of the gate 80.

In switching simulations, it has been found that propagation-delay variations of the gate 20 are considerably reduced in the gate 80. These reductions can be understood from the following analysis of the gate 20. As described above, it has been observed that the gate 20 exhibits propagation-delay variations which are dependent upon input-signal sequencing and that, in particular, the gate's propagation delay increases for the input sequence in which B has a logic value 1 and A changes from a logic value 0 to a logic value 1.

It is realized in the present invention that this delay variation increases with the length of time that the transistor 23 has been in a nonconducting state and, further, that it is associated with charging of a parasitic collector capacitance $C_p$ of this transistor (shown in FIG. 1) that is principally formed by collector-to-substrate capacitance $C_{cs}$ and integrated-circuit wiring capacitance $C_w$.

There are two input-signal sequences of interest that cause the output Q to transition from a logic value 0 to a logic value 1. In a first input sequence, the input signal B is high and input signal A transitions from a low to a high. In a second input sequence, the input signal A is high and input signal B transitions from a low to a high.

In the first input sequence, transistor 23 is off but transistor 33 is initially biased on and its current charges the parasitic capacitance $C_p$ until the potential on this capacitance reaches a level at which transistor 33 is no longer biased on (i.e., a potential level that is less than a diode drop beneath the upper side of the input signal B). When signal A then transitions from a low to a high, the current of the current source 56 is initially diverted to discharge the parasitic capacitance $C_p$. Subsequent to this discharge, transistor 33 turns on and the current is properly steered to the first resistor 44.

It is thus apparent that the charging of the parasitic capacitance $C_p$ is responsible for the observed propagation-delay variation of the first input sequence and that this delay increases with the length of time that the input signal A is low (up until a time at which the transistor 33 is no longer biased on).

In the second input sequence, transistor 23 is conducting the current of the current source 56 and, accordingly, no charge potential is built up on the parasitic capacitance $C_p$ to delay activation of the transistor 33. When the input signal B transitions from a low to a high, therefore, transistor 33 immediately responds and there is no increase in propagation delay to the output port 54.

In the gate 80 of FIG. 2, the above-described operations of the first and second input sequences are manipulated to substantially reduce sequencing-dependent propagation delays. Because of the cross-coupled input ports of the gate 80, the current-switching module 84 receives the second input sequence when the first input sequence is applied to the current-switching module 82 and receives the first input sequence when the second input sequence is applied to the current-switching module 82.

When the first input sequence is applied to input ports 30 and 40 of the gate 80, its output port 54 rapidly transitions from a low to a high because the current-switching module 84 rapidly responds to its applied input sequence (the second input sequence). When the second input sequence is applied to the gate 80, its output port 54 rapidly transitions from a low to a high because the current-switching module 82 rapidly responds to its applied input sequence (the first input sequence). Accordingly, the propagation-delay variations of the conventional gate 20 of FIG. 1 are substantially eliminated.

Figure 3:
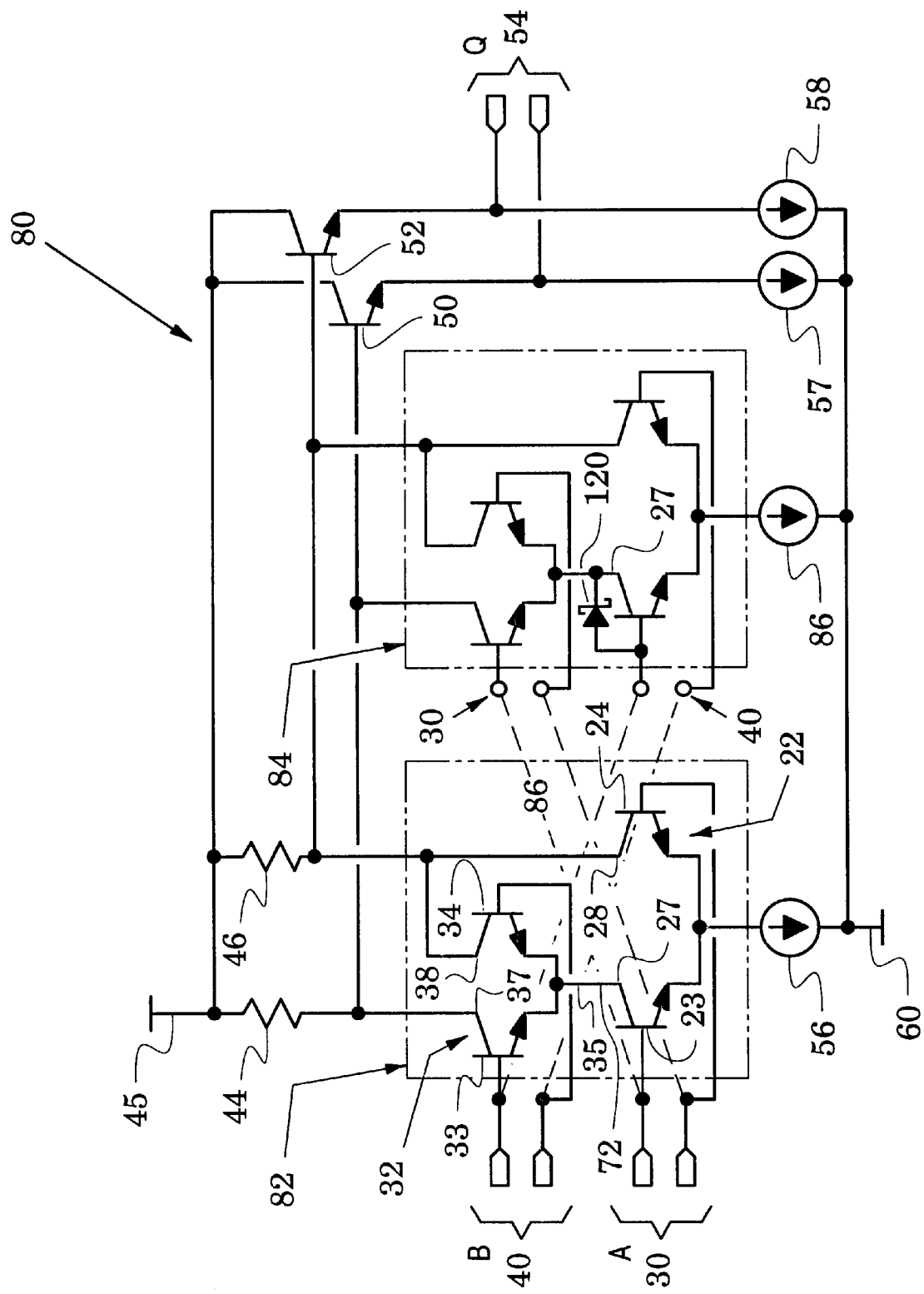
FIG. 3 is a detailed schematic of the AND/OR gate structure of FIG. 2.

The gate 80 of FIG. 2 is shown in more detail in FIG. 3. In particular, the structure of each of the current-switching modules 82 and 84 are shown to be the same as that of the current-switching module 81 of FIG. 1 with like elements indicated by like reference numbers (the reference numbers are shown only in the module 82).

The currents of the current-switching modules 82 and 84 are summed in the resistors 44 and 46 in FIGS. 2 and 3 which tends to generate a greater differential voltage swing than that of the gate 20 of FIG. 1. This change can be avoided, however, by halving the resistance value of resistors 44 and 46. Because transistors 33, 34 and 28 of each of the current-switching modules 82 and 84 are coupled to these resistors, their response times are dominated by the RC product of resistance and capacitance at their collectors. Therefore, halving the resistors 44 and 46 would initially seem to change the delay through the gate. However, the number of collectors coupled to these resistors has doubled relative to the conventional gate 20 of FIG. 1 and, accordingly, response time relative to the latter gate is substantially unchanged.

It is noted in FIG. 3 that the structure of each of the current-switching modules 82 and 84 couples one transistor collector across resistor 44 and two transistor collectors across resistor 46. Accordingly, resistor 46 is associated with a greater capacitance than is resistor 44 and the signal delay across the module to the buffer transistor 52 will be different than that to the buffer transistor 50.

Figure 4:
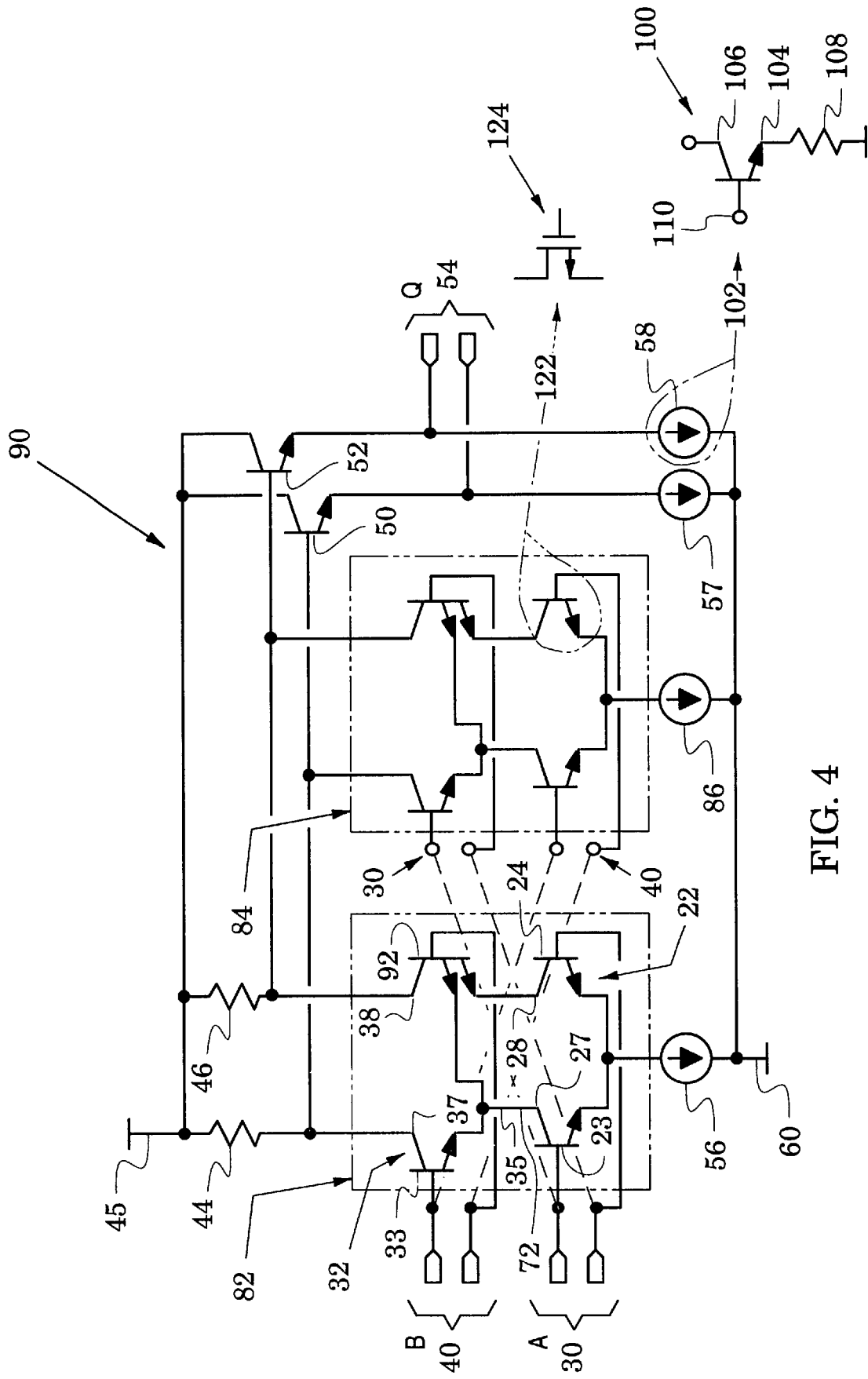
FIG. 4 is a schematic similar to FIG. 3 that shows another gate embodiment of the present invention.

This signal-delay difference is eliminated in the gate 90 of FIG. 4 which is similar to the gate 80 of FIG. 3 with like elements indicated by like reference numbers. The transistor 34 of each of the current-switching module 82 and 84 is, however, replaced by a dual emitter transistor 92 and the collector of transistor 24 is coupled to the added second emitter in each of these modules. Each of the resistors 44 and 46 are now in parallel with the same number of collector.

Operation of the gate 90 is essentially similar to that of the gate 80 of FIG. 3. When signal A is low at input port 30, for example, the current of current source 56 is steered through transistors 24 and 92 to the second resistor 46 regardless of signal B. In other words, the differential pair 22 steers the current of the source 56 to the second resistor 46 along a path that includes a portion of the second differential pair 32 (in particular, the second emitter and the collector of transistor 92). When signal A is high and signal B is low at input port 40, the current is steered to the second resistor 46 along a path that includes a different portion of the second differential pair 32 (in particular, the first emitter and the collector of transistor 92).

Gates of the invention have been shown with current sources (e.g., sources 56, 57, 58 and 86 of FIG. 3). The teachings of the invention may be practiced with any conventional current source. For example, the current source 58 of FIG. 4 can be realized with a source 100 as indicated by the broken-line replacement arrow 102. This source couples the emitter 104 of a transistor 106 across a resistor 108 and applies a voltage bias to the transistor's base 110.

In circuit simulations, it has been found that gate speed is enhanced and propagation-delay variations further reduced with the addition of a Schottky diode 120 across the base-collector junction of transistor 27 as shown in the second module 84 of FIG. 3. Because its forward bias is less than that of a bipolar transistor junction, the Schottky diode 120 insures that transistor 27 will not saturate. It is theorized, however, that the observed enhancement is actually realized because of the added capacitance of the Schottky diode.

To further enhance gate speed, the currents of the differential pair transistors of FIG. 3 (and, hence the currents of the current sources 56 and 86) are preferably set close to a current $I_{f_T}$ at which their transition frequency $f_T$ is a maximum. The value of this current is dependent upon the integrated-circuit process that is used to fabricate the gate. In a trench-isolated process, for example, it is ~350 microamps and it is ~600 microamps in a silicon-germanium process. The resistance of the first and second resistors 44 and 46 can then be adjusted to realize a desired differential voltage swing at the output port 54.

Gate speed may be further increased by optimized tradeoffs between these circuit parameters. For example, increasing the currents above $I_{f_T}$ and decreasing the resistors to maintain the same differential voltage swing may increase gate speed because the lowered RC time constant more than compensates for the current deviation from $I_{f_T}$.

In circuit simulations, it has been found that integrated circuit bipolar gates of the invention have substantially the same propagation delay (e.g., ~85 picoseconds) for all gate input sequences. In contrast, the conventional gate 20 of FIG. 1 exhibits propagation delays that vary (e.g., from ~80 to ~100 picoseconds) with input signal sequences. This reduction in propagation-delay variation realizes enhanced signal fidelity in demanding high-speed applications (e.g., automatic test equipment).

Although the invention has been illustrated with reference to differential pairs of bipolar transistors, the teachings of the invention can be practiced with other transistors, e.g., MOSFET transistors. In a CMOS realization, for example, the transistor pairs 22 and 32 of FIG. 3 could be realized respectively with NMOS and PMOS structures. An exemplary NMOS transistor 122 is substituted in FIG. 4 as indicated by a broken-line substitution arrow 124.

The buffer stages 50 and 52 in FIG. 3 have been realized in the form of emitter follower stages but other buffer embodiments can be used in other embodiments of the invention, e.g., cascode stages. The current of these buffer stages is preferably set high enough to drive parasitic capacitances that may be coupled to the output port.

The embodiments of the invention described herein are exemplary and numerous modifications, substitutions and rearrangements can be readily envisioned to achieve substantially equivalent results, all of which are intended to be embraced within the spirit and scope of the invention as defined in the appended claims.

I claim:

1. A gate that can execute the logic function Q=AB wherein Q is an output signal and A and B are first and second input signals, the gate comprising:
   first and second electrical loads; and
   first and second current-switching modules each coupled to said first and second electrical loads;
   wherein said first module includes:
   a) a first differential pair of transistors coupled to steer a first current to a first path and to steer said first current to said second load in response to respective polarities of said first input signal; and
   b) a second differential pair of transistors coupled to receive said first current from said first path and coupled to steer said first current to said first load and to steer said first current to said second load in response to respective polarities of said second input signal;
   and wherein said second module includes:
   a) a third differential pair of transistors coupled to steer a second current along a second path and to steer said second current to said second load in response to respective polarities of said second input signal; and
   b) a fourth differential pair of transistors coupled to receive said second current from said second path and coupled to steer said second current to said first load and to steer said second current to said second load in response to respective polarities of said first input signal;
   flow of said first and second currents through said first and second loads forming said output signal and the cross-coupling of said first and second input signals to said first and second current-switching modules reducing propagation-delay variations in said gate.

2. The gate of claim 1, wherein said transistors are bipolar transistors.

3. The gate of claim 1, wherein said first and second electrical loads respectively comprise first and second resistors.

4. The gate of claim 3, further including first and second buffer stages coupled respectively to said first and second resistors.

5. The gate of claim 4, wherein said first and second buffer stages are each an emitter-coupled bipolar transistor.

6. The gate of claim 1, further including first and second current sources coupled to respectively supply said first current and said second current to said first and second modules.

7. The gate of claim 6, wherein each of said current sources includes:
   a bipolar transistor having an emitter and having a base responsive to a reference voltage; and
   a resistor coupled to said emitter.

8. The gate of claim 1, wherein:
   said first differential pair steers said first current to said second load along a path that includes a portion of said second differential pair; and
   said third differential pair steers said second current to said second load along a path that includes a portion of said fourth differential pair.

9. A gate that can execute the logic function Q=AB wherein Q is an output signal and A and B are first and second input signals, the gate comprising:
   first, second, third and fourth differential pairs of transistors that each have a common port, first and second ouput ports and a differential input port and that each steer a current at said common port to said first output port and steer said current to said second output port in reponse to respective polarities of an input signal at said input port;
   a first electrical load coupled to the first ouput ports of said second and fourth differential pairs;
   a second electrical load coupled to the second ouput ports of said first, second, third and fourth differential pairs; and
   first and second current sources respectively coupled to the common port of said first and third differential pairs;
   wherein:
   a) the common port of said second differential pair is coupled to the first output port of said first differential pair;
   b) the common port of said fourth differential pair is coupled to the first output port of said third differential pair;
   c) the input ports of said first and fourth differential pairs are coupled together to form a first gate input port; and
   d) the input ports of said second and third differential pairs are coupled together to form a second gate input port;
   current flow from said first and second current sources through said first and second loads forming said output signal when said first and second input signals are applied respectively to said and second gate input ports.

10. The gate of claim 9, wherein said transistors are bipolar transistors.

11. The gate of claim 9, wherein said first and second electrical loads respectively comprise first and second resistors.

12. The gate of claim 11, further including first and second output buffer stages coupled respectively to said first and second resistors.

13. The gate of claim 12, wherein said first and second output buffer stages are each a bipolar transistor arranged as an emitter follower stage.

14. The gate of claim 9, wherein:
   said second electrical load is coupled to the second output port of said first differential pair along a path that includes a portion of said second differential pair; and
   said second electrical load is coupled to the second output port of said third differential pair along a path that includes a portion of said fourth differential pair.

15. The gate of claim 14, wherein said portion of said second differential pair includes an additional emitter and said portion of said second differential pair includes an additional emitter.

16. A method of reducing propagation-delay variations in a differential-signal gate that can execute the logic function Q=AB wherein Q is an output signal at an output port of said gate and A and B are first and second input signals at first and second input ports of said gate and said variations are a function of the sequencing of said first and second input signals, the method comprising the steps of:
   providing first and second ones of said gate;
   coupling together said output ports of said first and second gates; and
   cross coupling said first and second input ports of said first and second gates to reduce said variations.

17. The method of claim 16, wherein said providing step includes the step of forming said first and second gates with differential pairs of transistors.

18. The method of claim 17, wherein said transistors are bipolar transistors.

* * * * *